(12) United States Patent
Kawahara

(10) Patent No.: US 12,519,075 B2
(45) Date of Patent: Jan. 6, 2026

(54) SEMICONDUCTOR DEVICE COMPRISING MAIN WIRING WIRE AND REINFORCING WIRE CONNECTED TO AT LEAST ONE SEMICONDUCTOR ELEMENT

(71) Applicant: Mitsubishi Electric Corporation, Tokyo (JP)

(72) Inventor: Fumihito Kawahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 570 days.

(21) Appl. No.: 17/936,430

(22) Filed: Sep. 29, 2022

(65) Prior Publication Data
US 2023/0163093 A1 May 25, 2023

(30) Foreign Application Priority Data
Nov. 25, 2021 (JP) .................................. 2021-191044

(51) Int. Cl.
*H01L 23/00* (2006.01)
(52) U.S. Cl.
CPC .... *H01L 24/46* (2013.01); *H01L 2924/35121* (2013.01)
(58) Field of Classification Search
CPC ..................... H01L 24/46; H01L 24/49; H01L 2924/35121; H01L 23/49811; H01L 23/3107; H01L 23/49844
(Continued)

(56) References Cited

U.S. PATENT DOCUMENTS

2007/0035019 A1* 2/2007 Carney .................. H01L 24/97
257/E23.125
2011/0241198 A1* 10/2011 Azuma .................. H01L 24/37
257/696
(Continued)

FOREIGN PATENT DOCUMENTS

DE  10 2015 204 878 A1   9/2015
DE  10 2019 200 634 A1   8/2019
(Continued)

OTHER PUBLICATIONS

An Office Action issued by the German Patent and Trademark Office on Oct. 31, 2023, which corresponds to German Patent Application No. 102022129559.1 and is related to U.S. Appl. No. 17/936,430; with English language translation.
(Continued)

*Primary Examiner* — Didarul A Mazumder
(74) *Attorney, Agent, or Firm* — Studebaker Brackett PLLC

(57) ABSTRACT

A semiconductor device includes: a main wiring wire electrically connected to a semiconductor element; a reinforcing wire connected to the semiconductor element, the reinforcing wire positioned on the same side as the semiconductor element or on the opposite side of the semiconductor element, with respect to the main wiring wire in a cross-sectional view; and a sealing resin configured to cover the semiconductor element, the main wiring wire, and the reinforcing wire. The reinforcing wire is connected to a plurality of portions of the semiconductor element, or both end portions of the reinforcing wire are positioned inside an outline of the semiconductor element in a plan view.

15 Claims, 19 Drawing Sheets

(58) Field of Classification Search
USPC .................................. 257/784, 734; 438/617
See application file for complete search history.

(56) References Cited

U.S. PATENT DOCUMENTS

| | | |
|---|---|---|
| 2014/0339690 A1 | 11/2014 | Chan et al. |
| 2015/0270240 A1 | 9/2015 | Tokubo |
| 2016/0111345 A1* | 4/2016 | Kawase .............. H01L 23/3675 257/706 |
| 2019/0348390 A1* | 11/2019 | Zaiser ..................... H01L 24/48 |
| 2020/0273760 A1* | 8/2020 | Fukumoto ............... H01L 24/73 |

FOREIGN PATENT DOCUMENTS

| | | |
|---|---|---|
| JP | 2005-123379 A | 5/2005 |
| JP | 2014-120679 A | 6/2014 |
| WO | 2018/235511 A1 | 12/2018 |

OTHER PUBLICATIONS

An Office Action; "Notice of Reasons for Refusal," mailed by the Japanese Patent Office on Aug. 27, 2024, which corresponds to Japanese Patent Application No. 2021-191044 and is related to U.S. Appl. No. 17/936,430; with English language translation.

* cited by examiner

F I G. 1
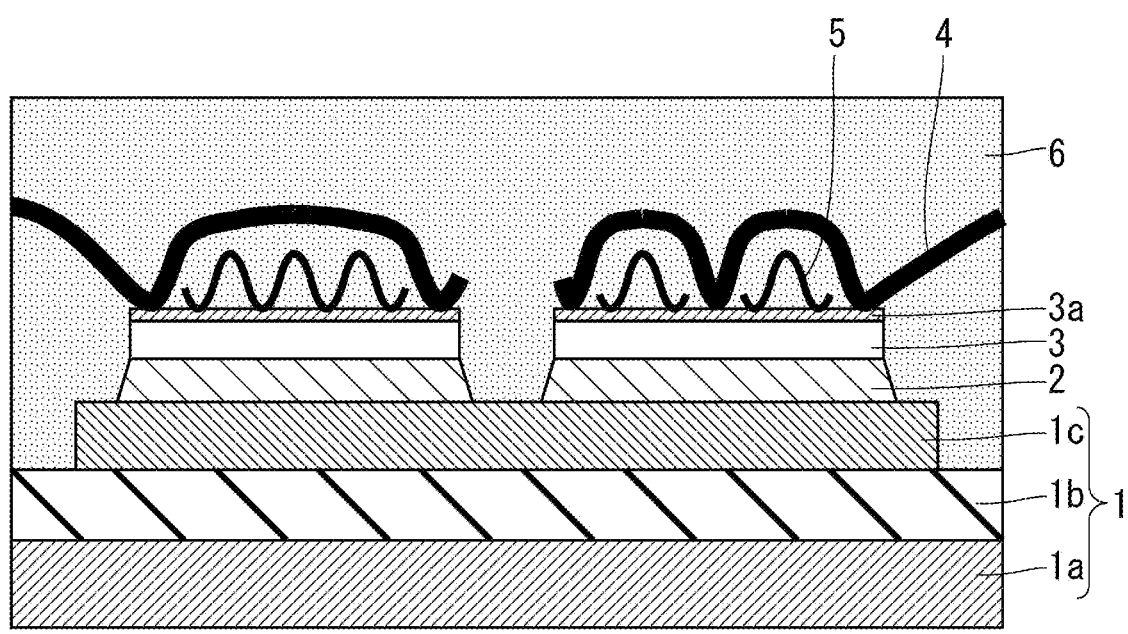

F I G. 2
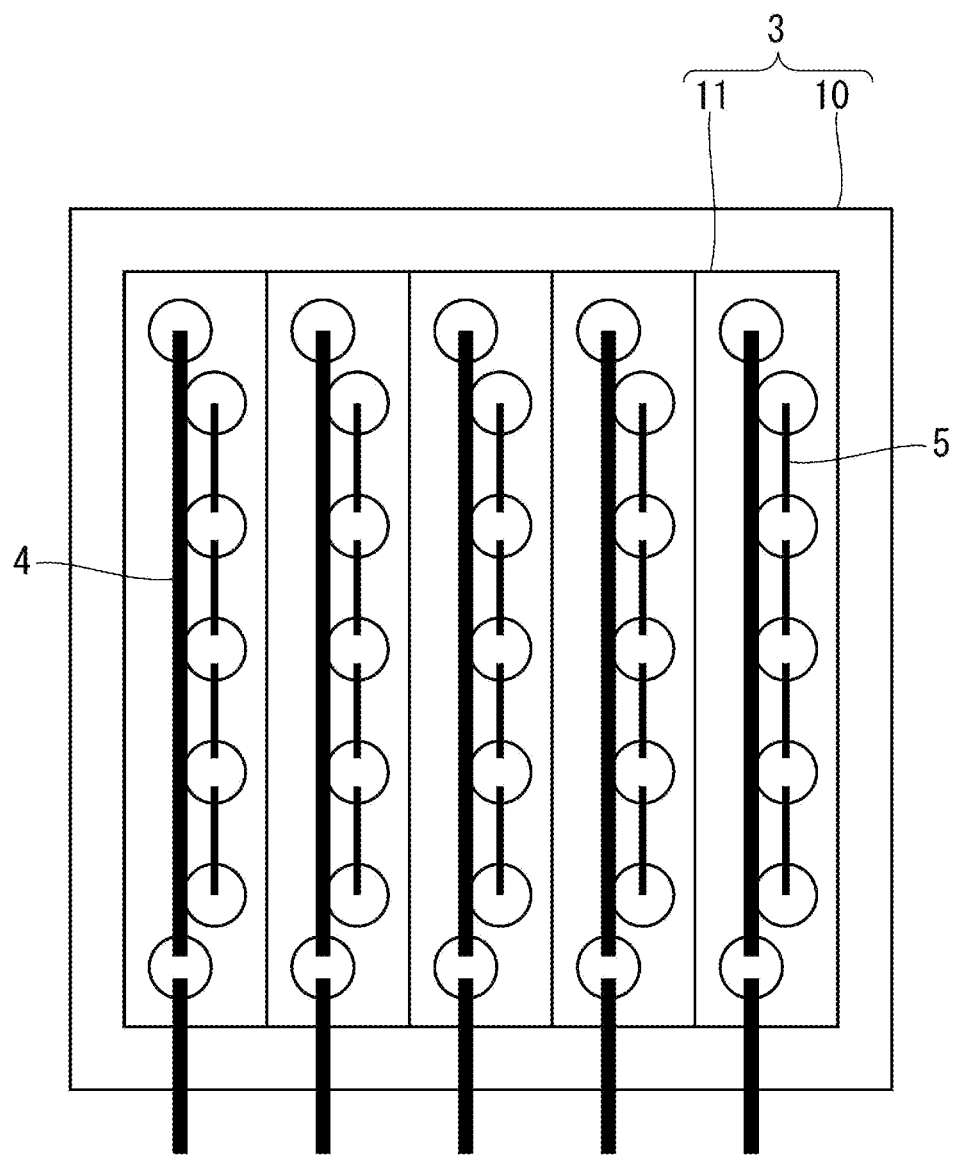

F I G. 1 0
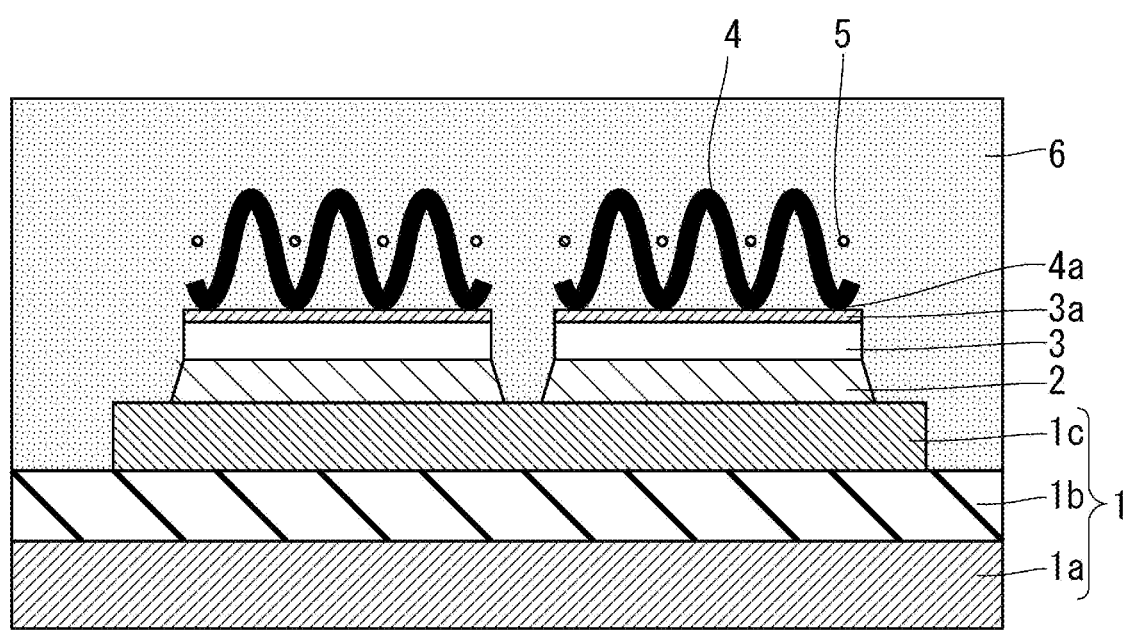

F I G. 1 3
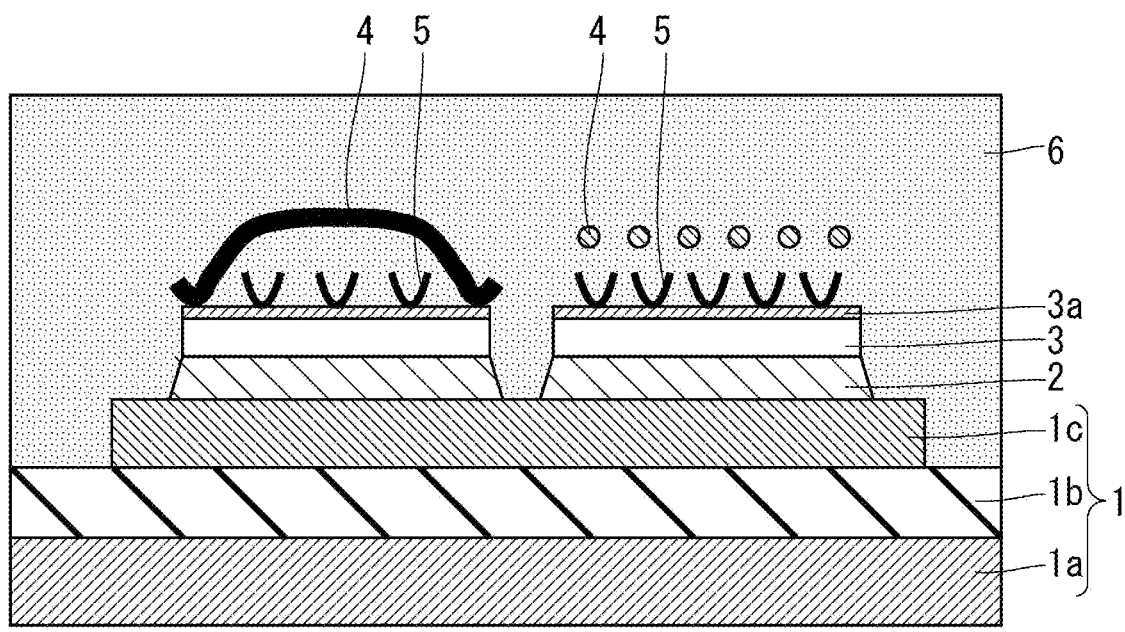

F I G. 1 6
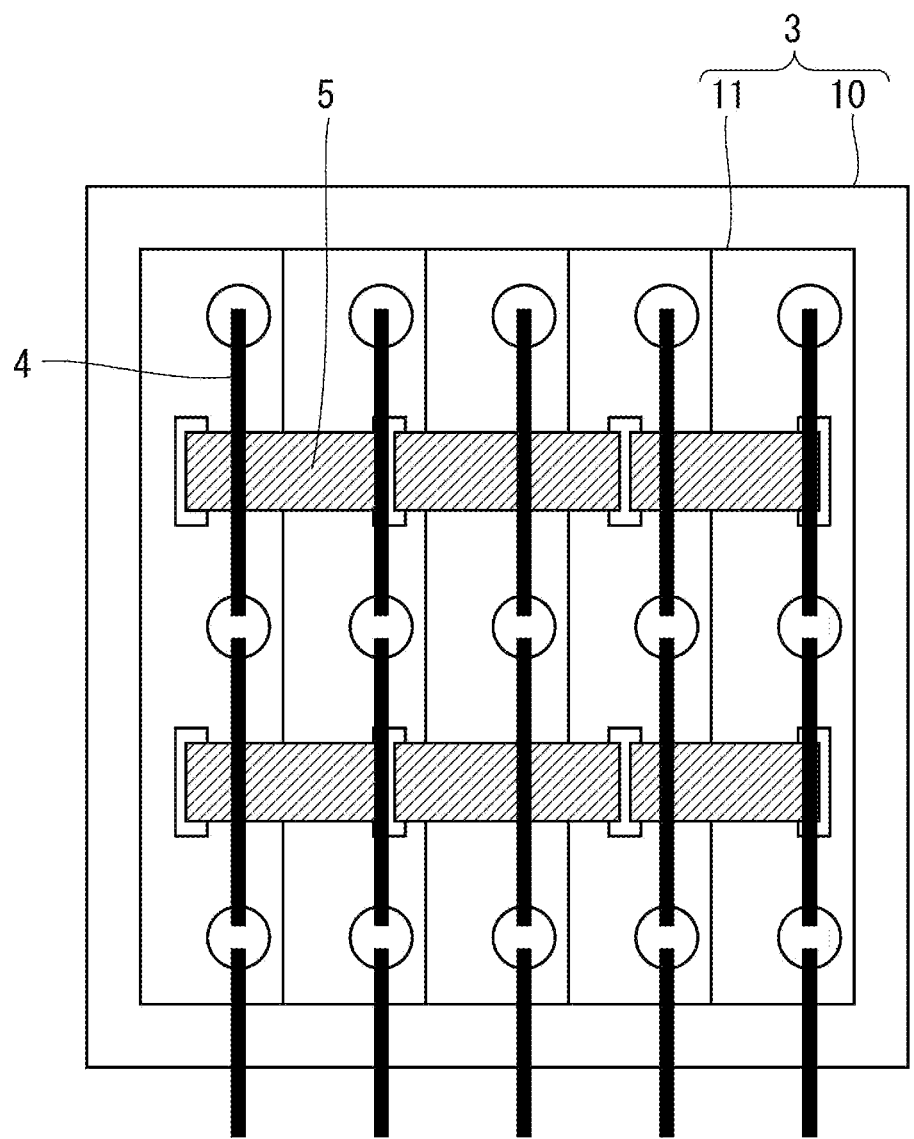

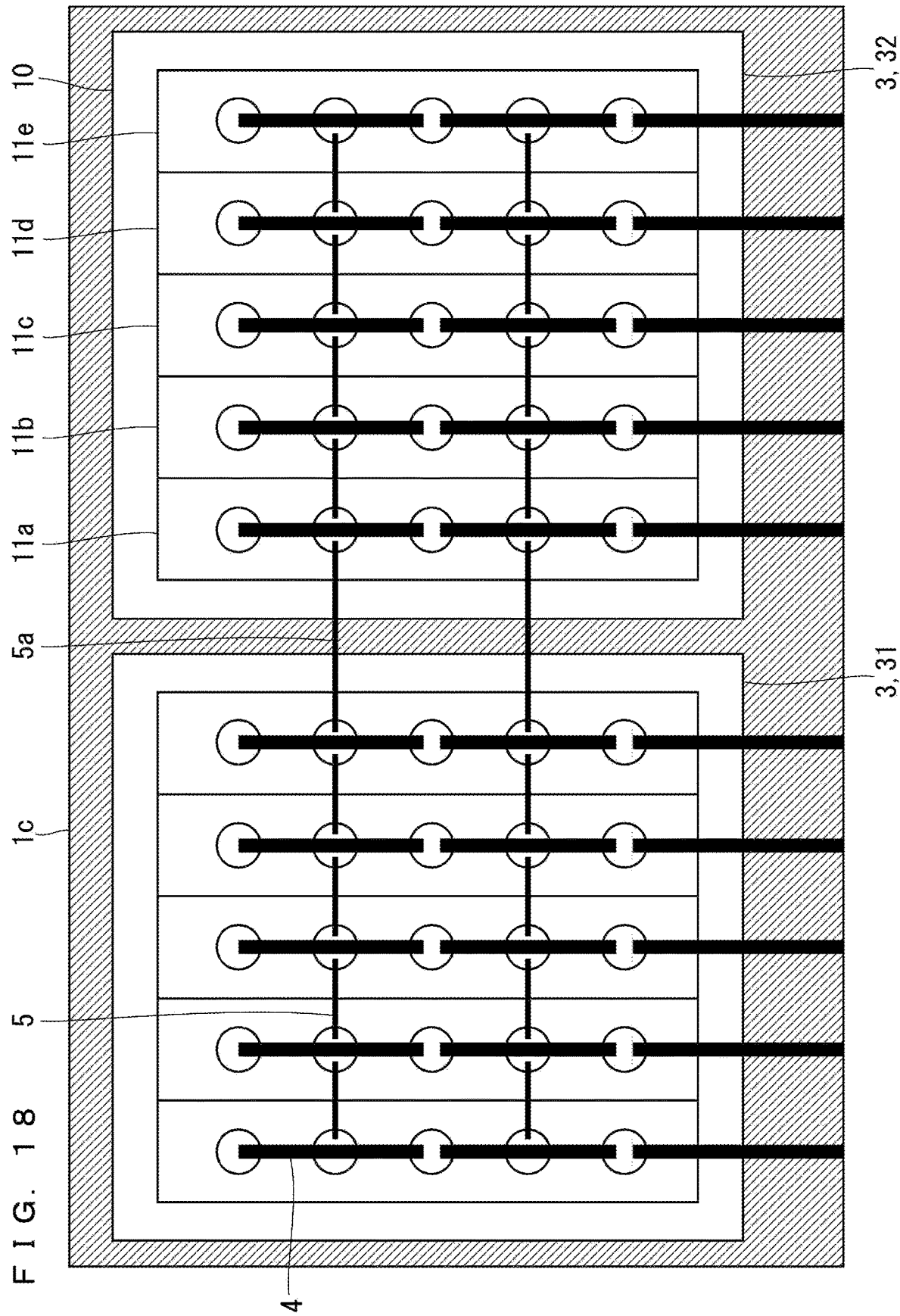

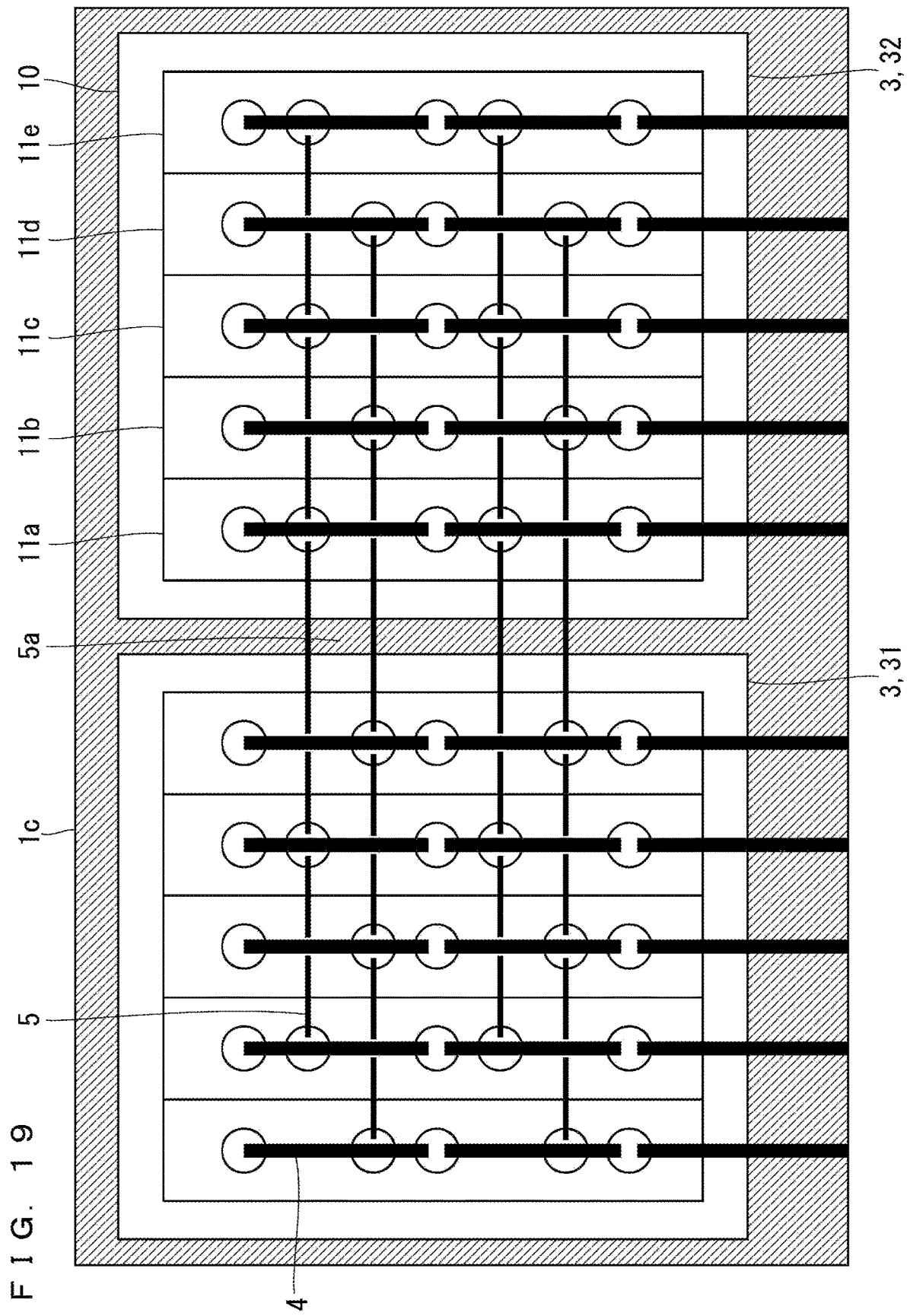

SEMICONDUCTOR DEVICE COMPRISING MAIN WIRING WIRE AND REINFORCING WIRE CONNECTED TO AT LEAST ONE SEMICONDUCTOR ELEMENT

BACKGROUND OF THE INVENTION

Field of the Invention

The present disclosure relates to a semiconductor device.

Description of the Background Art

Japanese Patent Application Laid-Open No. 2014-120679 proposes a semiconductor device in which a reinforcing wire such as a disconnection preventing wire is connected to a peripheral portion of a semiconductor element. According to such a semiconductor device, it is possible to suppress, with the reinforcing wire, peeling of the sealing resin caused by concentration of repeated thermal stress.

Since the reinforcing wire of Japanese Patent Application Laid-Open No. 2014-120679 is connected to a peripheral portion of a semiconductor element, peeling of a sealing resin in the peripheral portion can be suppressed. However, the reinforcing wire of Japanese Patent Application Laid-Open No. 2014-120679 does not act on the semiconductor element, so that there is no effect of directly suppressing peeling of the sealing resin from the semiconductor element. Therefore, there has been a possibility that the sealing resin is peeled off from the semiconductor element under an actual use environment.

SUMMARY

A semiconductor device according to the present disclosure includes: at least one semiconductor element; a main wiring wire electrically connected to the at least one semiconductor element; a reinforcing wire connected to the at least one semiconductor element, the reinforcing wire positioned on the same side as the at least one semiconductor element or on the opposite side of the at least one semiconductor element with respect to the main wiring wire in a cross-sectional view; and a sealing resin configured to cover the at least one semiconductor element, the main wiring wire, and the reinforcing wire. The reinforcing wire is connected to a plurality of portions of the at least one semiconductor element, or both end portions of the reinforcing wire are positioned inside an outline of the at least one semiconductor element in a plan view.

It is possible to suppress peeling of the sealing resin from the semiconductor element.

These and other objects, features, aspects and advantages of the present disclosure become more apparent from the following detailed description of the present disclosure when taken in conjunction with the accompanying drawings.

BRIEF DESCRIPTION OF THE DRAWINGS

FIG. 1 is a cross-sectional view showing a configuration of a semiconductor device according to a first preferred embodiment;

FIG. 2 is a plan view showing a configuration of a semiconductor device according to a second preferred embodiment;

FIG. 10 is a cross-sectional view showing a configuration of a semiconductor device according to a fifth preferred embodiment;

FIG. 13 is a cross-sectional view showing a configuration of a semiconductor device according to a sixth preferred embodiment;

FIG. 16 is a plan view showing a configuration of a semiconductor device according to a seventh preferred embodiment;

FIG. 18 is a plan view showing a configuration of a semiconductor device according to an eighth preferred embodiment; and FIG. 19 is a plan view showing a configuration of a semiconductor device according to a modification of the eighth preferred embodiment.

DESCRIPTION OF THE PREFERRED EMBODIMENTS

Figure 3:
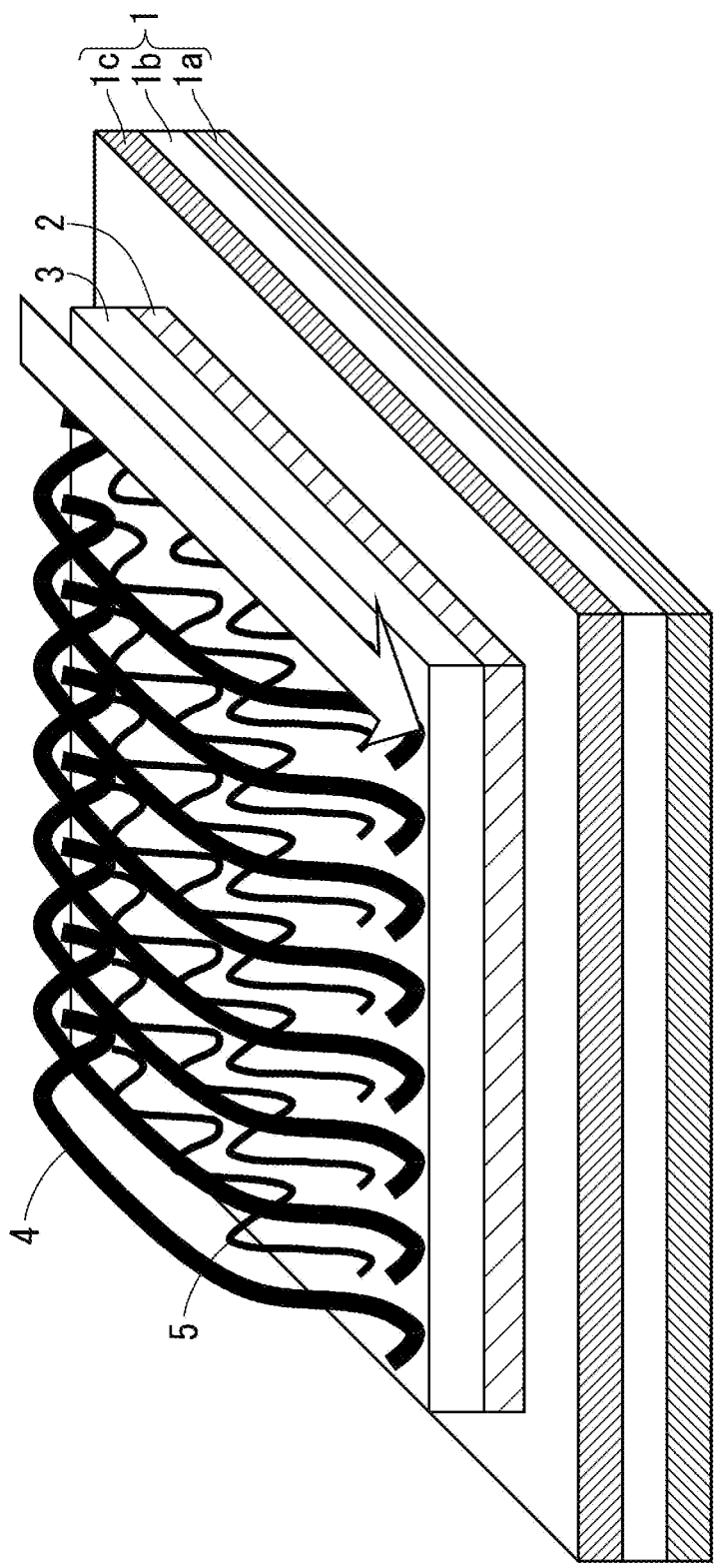
FIG. 3 is a three-dimensional view showing a configuration of the semiconductor device according to the second preferred embodiment.

Hereinafter, preferred embodiments will be described with reference to the accompanying drawings. Features described in the following preferred embodiments are illustrative, and all features are not necessarily essential. In addition, in the following description, similar components in a plurality of preferred embodiments are denoted by the same or similar reference numerals, and different components will be mainly described. In addition, in the following description, a specific position and direction such as "upper", "lower", "left", "right", "front", or "back" do not necessarily need to coincide with a position and direction at the time of actual implementation.

First Preferred Embodiment

FIG. 1 is a cross-sectional view showing a configuration of a semiconductor device according to the present first preferred embodiment. The semiconductor device in FIG. 1 is, for example, a power semiconductor device. The semiconductor device in FIG. 1 includes an element mounting portion 1, a joint member 2, a semiconductor element 3, a main wiring wire 4, a reinforcing wire 5, a sealing resin 6, and a case and an external connection terminal (not shown). It should be noted that when the main wiring wire 4 and the reinforcing wire 5 are not distinguished from each other in the following description, these may be described only as wires.

The element mounting portion 1 includes an insulating layer 1b, a back-surface metal plate 1a provided on the lower surface of the insulating layer 1b, and a metal circuit pattern 1c provided on the upper surface of the insulating layer 1b. The element mounting portion 1 may be, for example an insulated metal baseplate (IMB) in which a direct bonded copper (DBC) substrate or a resin substrate is used as the insulating layer 1b. In addition, the semiconductor device according to the present first preferred embodiment may have a transfer mold structure in which a lead frame is used for the metal circuit pattern 1c, or may have a full transfer mold structure in which the insulating layer 1b and the back-surface metal plate 1a are omitted.

The joint member 2 electrically and mechanically connects the semiconductor element 3 to the metal circuit pattern 1c by joining the semiconductor element 3 and the metal circuit pattern 1c of the element mounting portion 1. The material of the joint member 2 is, for example, solder, a sintered material, or a conductive adhesive.

The semiconductor element 3 includes a front surface electrode 3a provided on the upper surface. The semiconductor element 3 is, for example, an insulated gate bipolar transistor (IGBT), a reverse conducting-IGBT (RC-IGBT), a metal oxide semiconductor field effect transistor (MOSFET), a PN junction diode (PND), a Schottky barrier diode (SBD), or a free wheeling diode (FWD), and transmits and receives an electric signal to and from an external apparatus through the main wiring wire 4, the metal circuit pattern 1c, an external connection terminal (not shown), and the like.

The material of the element 3 may be normal silicon (Si) or a wide band gap semiconductor such as silicon carbide (SiC), gallium nitride (GaN), or diamond. When the material of the semiconductor element 3 is a wide band gap semiconductor, stable operation under high temperature and high voltage, and higher switching speed can be achieved. It should be noted that the number of semiconductor elements 3 may be one or more.

One or more main wiring wires 4 are electrically connected to a front surface electrode 3a of a semiconductor element 3, and electrically connected to an external connection terminal or a metal circuit pattern 1c.

The reinforcing wire 5 is connected to the semiconductor element 3. It should be noted that the reinforcing wire 5 may be electrically and mechanically connected to the semiconductor element 3, or may be mechanically connected without being electrically connected to the semiconductor element 3.

In the present first preferred embodiment, in a cross-sectional view, the reinforcing wire 5 is positioned on the semiconductor element 3 side with respect to the main wiring wire 4, that is, below the loop of the main wiring wire 4. It should be noted that as will be described in another preferred embodiment, in the cross-sectional view, the reinforcing wire 5 may be positioned on the opposite side of the semiconductor element 3 with respect to the main wiring wire 4, that is, above the loop of the main wiring wire 4.

In the present first preferred embodiment, the reinforcing wire 5 is connected to a plurality of portions of the semiconductor element 3, and both ends of the reinforcing wire 5 are positioned inside the outline of the semiconductor element 3 in a plan view. It should be noted that a configuration in which the reinforcing wire 5 is connected to a plurality of portions of the semiconductor element 3, and both ends of the reinforcing wire 5 are not positioned inside the outline of the semiconductor element 3 in a plan view may be used. Alternatively, a configuration in which the reinforcing wire 5 is not connected to a plurality of portions of the semiconductor element 3, and both ends of the reinforcing wire 5 are positioned inside the outline of the semiconductor element 3 in a plan view may be used. These configurations will be described in another preferred embodiment.

In the present first preferred embodiment, the reinforcing wire 5 is provided on substantially the entire surface of the semiconductor element 3, but as will be described in another preferred embodiment, the reinforcing wire 5 may be provided to be limited around the connection portion between the semiconductor element 3 and the main wiring wire 4.

The case (not shown) is connected to the element mounting portion 1, and surrounds the joint member 2, the semiconductor element 3, the main wiring wire 4, the reinforcing wire 5, and a space therearound. One end of the external connection terminal is provided in the space of the case, and the other end of the external connection terminal is provided outside the case.

The sealing resin 6 is filled in the space of the case, and covers and protects the joint member 2, the semiconductor element 3, the main wiring wire 4, and the reinforcing wire 5.

Summary of First Preferred Embodiment

In the present first preferred embodiment, since not only the main wiring wire 4 but also the reinforcing wire 5 is connected onto the semiconductor element 3, the number of wire connections per unit area of the upper surface of the semiconductor element 3 increases. Accordingly, since it is possible to enhance the anchor effect of the sealing resin 6 by the wire, it is possible to enhance the effect of suppressing peeling of the sealing resin 6 from the semiconductor element 3, that is, the peeling suppression effect.

In addition, since the ratio of the resin of the sealing resin 6 per unit volume of the portion on the semiconductor element 3 decreases and the ratio of the metal of the wire increases, the linear expansion coefficient of the portion can be brought close to the linear expansion coefficient of the front surface electrode 3a of the semiconductor element 3. As a result, it is possible to suppress peeling due to thermal stress generated by a mismatch between the linear expansion coefficient of the resin and the linear expansion coefficient of the front surface electrode 3a. It should be noted that when the material of the reinforcing wire 5 and the material of the front surface electrode 3a are the same, improvement in this effect can be expected. In addition, since the heat capacity of the portion on the semiconductor element 3 can be increased by the reinforcing wire 5, the junction temperature Tj at the time of energization can be lowered, and uniformity of the temperature distribution can be expected.

In addition, in the present first preferred embodiment, the reinforcing wire 5 is positioned on the semiconductor element 3 side with respect to the main wiring wire 4 in a cross-sectional view. According to this configuration, since it is possible to suppress the position change of the connection portion of the main wiring wire 4 accompanying providing the reinforcing wire 5, it is possible to facilitate the design change from the existing article.

Second Preferred Embodiment

FIG. 2 is a plan view showing a configuration of a semiconductor device according to the present second preferred embodiment, and FIG. 3 is a three-dimensional view showing the configuration. In the present second preferred embodiment, the semiconductor element 3 includes an ineffective region 10 and an effective region 11 provided on the upper surface. The ineffective region 10 surrounds the effective region 11. The effective region 11 corresponds to a region where the front surface electrode 3*a* in FIG. 1 is provided, and a plurality of portions of the effective region 11 are connected to the main wiring wire 4 and the reinforcing wire 5. Then, in the present second preferred embodiment, as shown in FIG. 2, the reinforcing wire 5 is parallel to the main wiring wire 4 in a plan view.

It should be noted that in FIG. 2, the reinforcing wire 5 is shifted from the main wiring wire 4 in a plan view, but the reinforcing wire 5 may overlap the main wiring wire 4 in a plan view. In a plan view in FIG. 2 and the like, the connection portion where the semiconductor element 3 is bonded to each of the main wiring wire 4 and the reinforcing wire 5 is shown in a circular shape, but the shape of the connection portion is not limited to the circular shape. In addition, in a plan view in FIG. 2 and the like, the main wiring wire 4 and the reinforcing wire 5 are partitioned at the connection portion with the semiconductor element 3 for convenience, but do not need to be partitioned.

Summary of Second Preferred Embodiment

In the present second preferred embodiment, since the reinforcing wire 5 is parallel to the main wiring wire 4 in a plan view, when the sealing resin 6 is injected in the manufacturing step of the semiconductor device as shown in FIG. 3, the sealing resin 6 easily flows along the arrangement of the wires. Therefore, air voids generated by the sealing resin 6 entraining air during the flow are suppressed, and the filling property of the sealing resin 6 is improved, so that the insulating characteristics of the semiconductor device can be improved.

Third Preferred Embodiment

Figure 4:
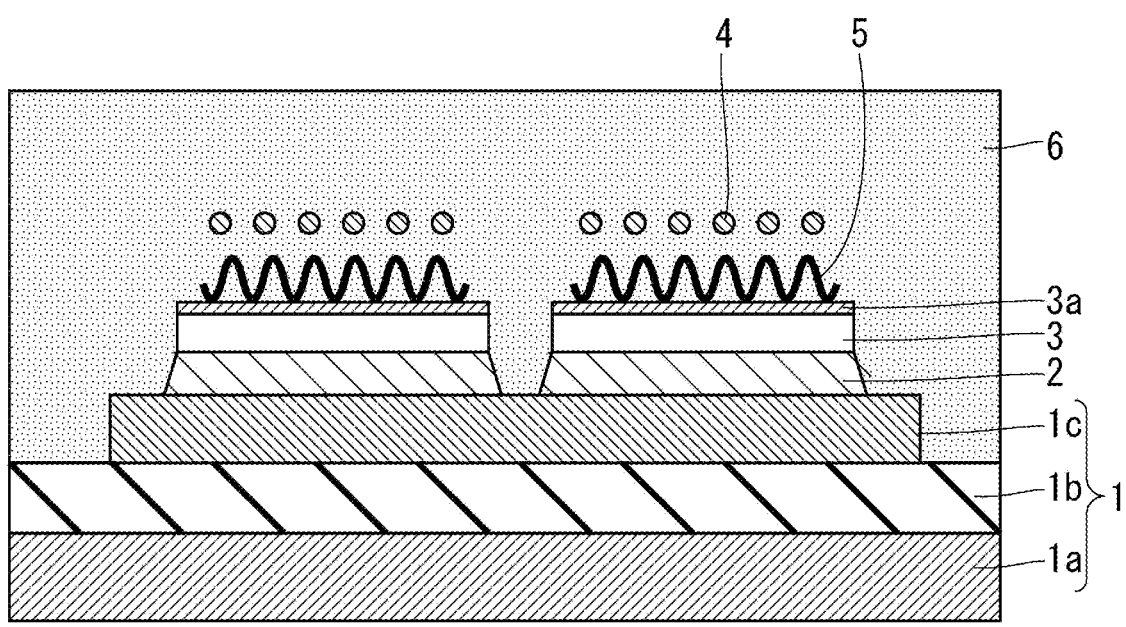
FIG. 4 is a cross-sectional view showing a configuration of a semiconductor device according to a third preferred embodiment.
Figure 5:
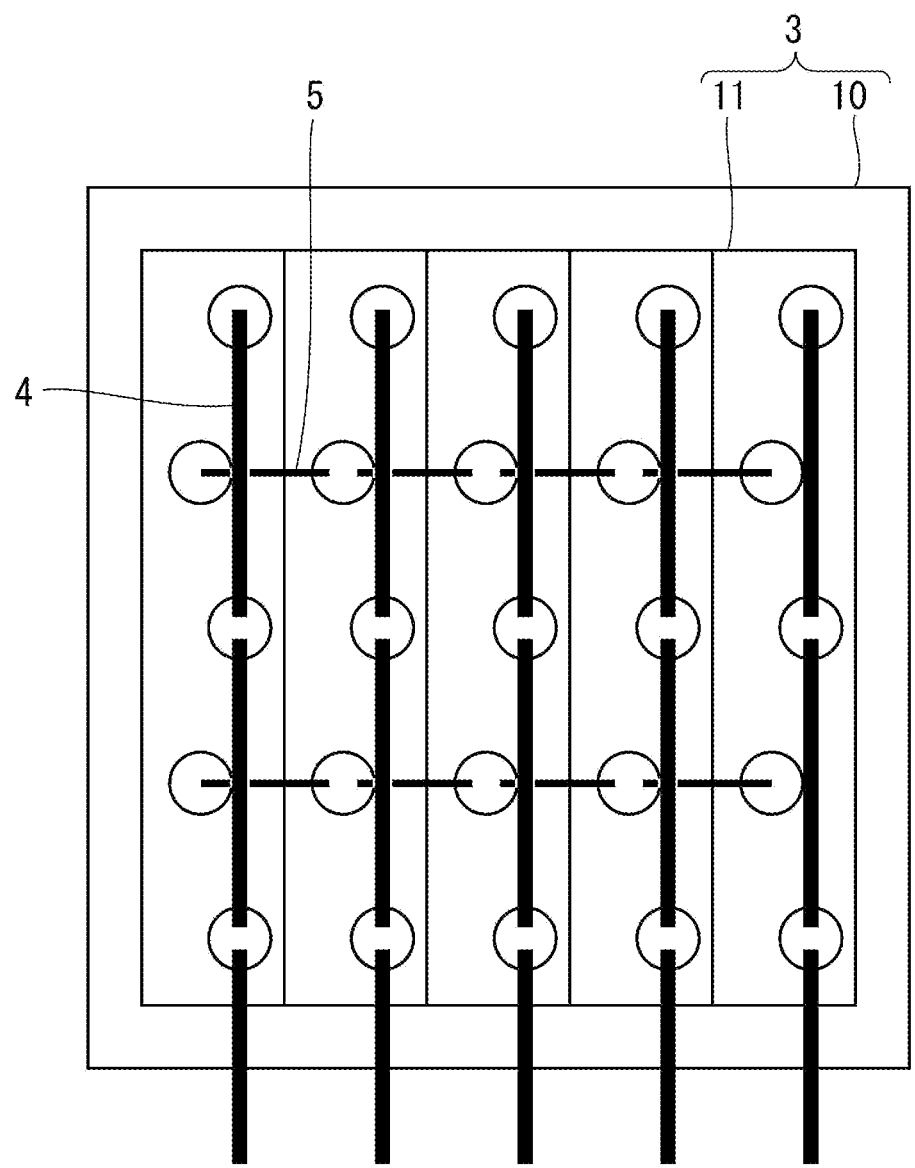
FIG. 5 is a plan view showing a configuration of the semiconductor device according to the third preferred embodiment.
Figure 6:
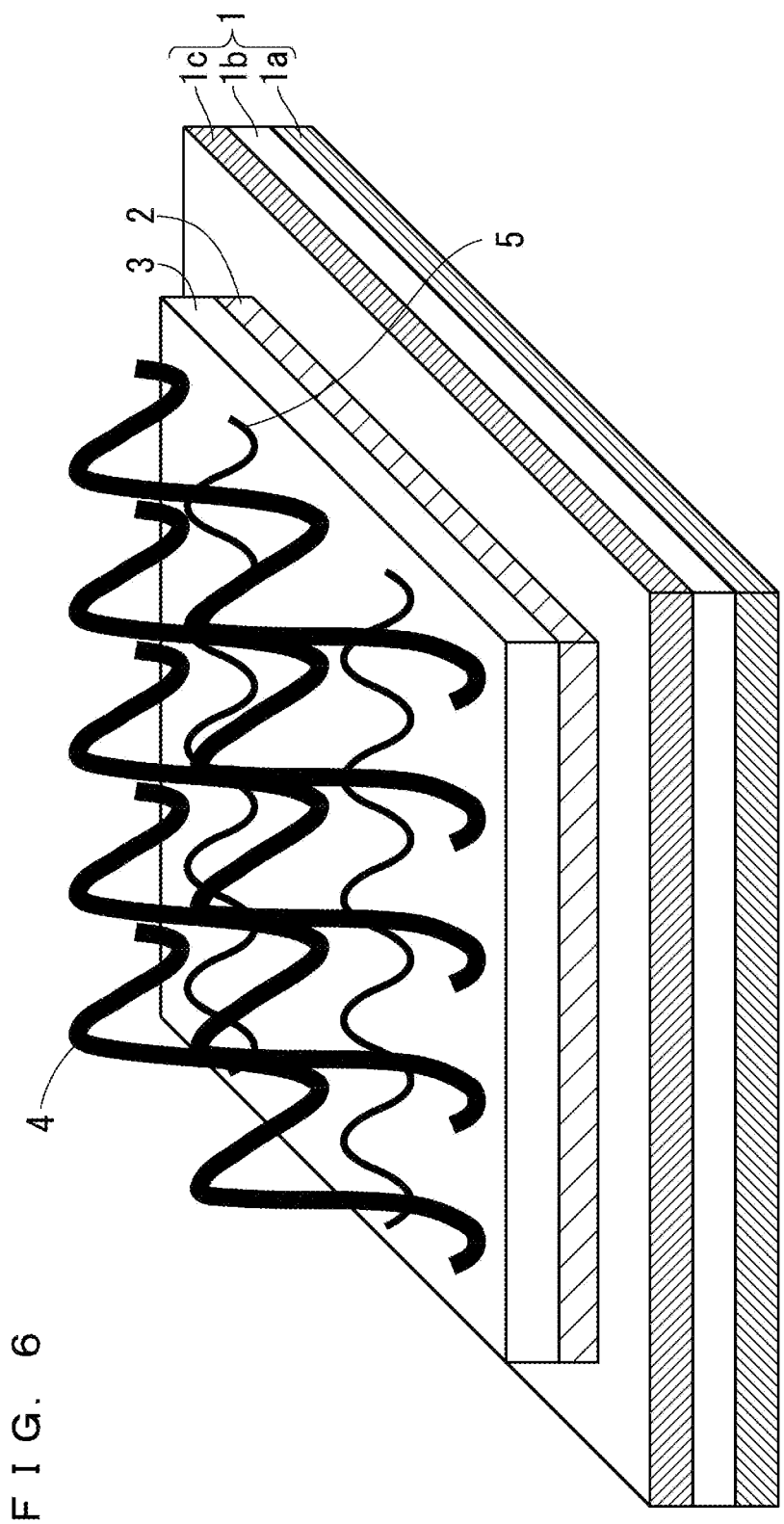
FIG. 6 is a three-dimensional view showing a configuration of the semiconductor device according to the third preferred embodiment.

FIG. 4 is a cross-sectional view showing a configuration of a semiconductor device according to the present third preferred embodiment, and FIGS. 5 and 6 are a plan view and a three-dimensional view showing the configuration, respectively. It should be noted that in a plan view in FIG. 5 and the like, for convenience, a white line is attached to the outline of the wire positioned on the front side at a place where the wires intersect. The configuration of the present third preferred embodiment is different from the configuration of the second preferred embodiment in that the reinforcing wire 5 intersects the main wiring wire 4 in a plan view. It should be noted that in FIG. 5, the main wiring wire 4 and the reinforcing wire 5 are orthogonal to each other, but do not necessarily need to be orthogonal to each other.

Summary of Third Preferred Embodiment

The anchor effect of the sealing resin 6 by the wire occurs in the upper direction and the extending direction of the wire. Therefore, when the wires intersect with each other, an anchor effect occurs in the upper direction of the main wiring wire 4 and the reinforcing wire 5 and in two extending directions different from each other of the main wiring wire 4 and the reinforcing wire 5. According to the present third preferred embodiment as described above, since the anchor effect is generated in directions more than directions of the second preferred embodiment, further improvement in the peeling suppression effect can be expected.

Fourth Preferred Embodiment

Figure 7:
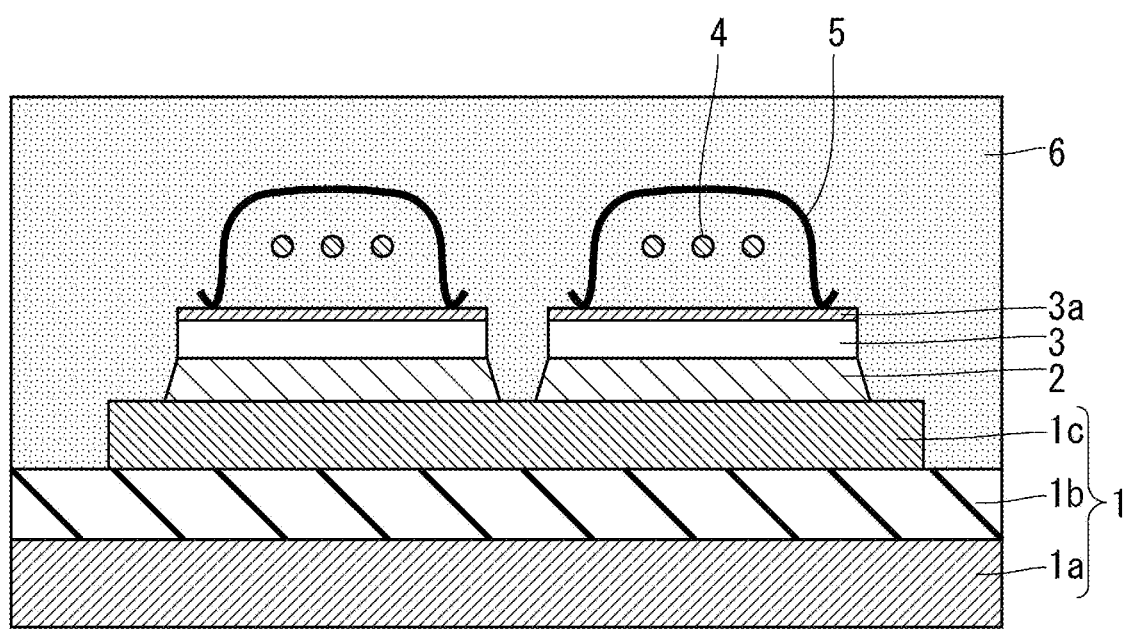
FIG. 7 is a cross-sectional view showing a configuration of a semiconductor device according to a fourth preferred embodiment.
Figure 8:
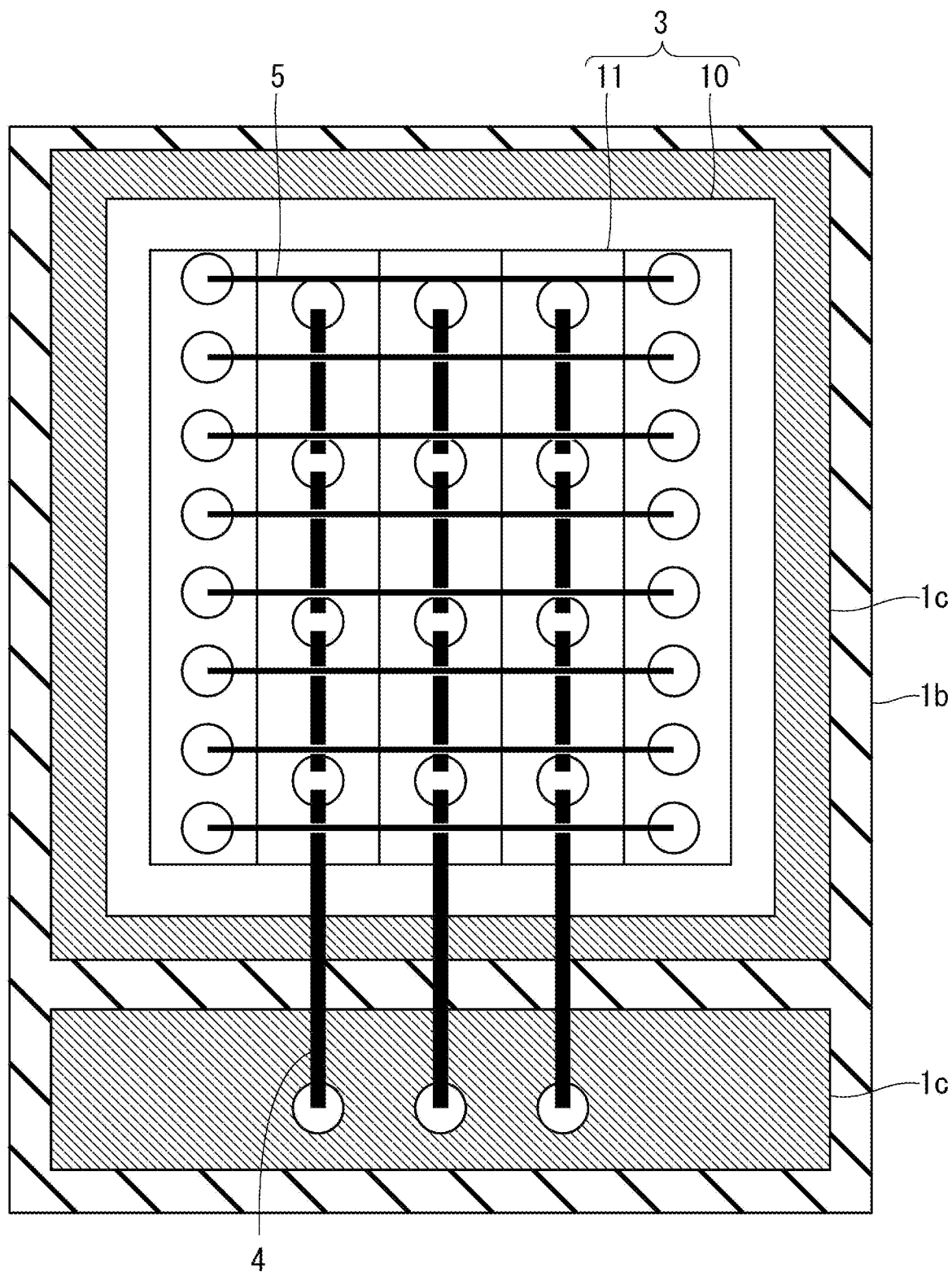
FIG. 8 is a plan view showing a configuration of the semiconductor device according to the fourth preferred embodiment.

FIG. 7 is a cross-sectional view showing a configuration of a semiconductor device according to the present fourth preferred embodiment, and FIG. 8 is a plan view showing the configuration. In the first to third preferred embodiments, the reinforcing wire 5 is positioned on the semiconductor element 3 side with respect to the main wiring wire 4 in a cross-sectional view. On the other hand, in the present fourth preferred embodiment, in the cross-sectional view, the reinforcing wire 5 is positioned on the opposite side of the semiconductor element 3 with respect to the main wiring wire 4, that is, above the loop of the main wiring wire 4. In FIGS. 7 and 8, the reinforcing wire 5 is positioned above the main wiring wire 4 on the semiconductor element 3 and intersects with the main wiring wire 4. It should be noted that in FIGS. 7 and 8, the present fourth preferred embodiment is applied to the third preferred embodiment, but may be applied to the second preferred embodiment.

FIG. 8 shows a structure in which the main wiring wire 4 is connected to the metal circuit pattern 1*c* of the element mounting portion 1. The semiconductor element 3 transmits and receives an electric signal to and from an external apparatus through the main wiring wire 4, the metal circuit pattern 1*c*, an external output terminal, and the like.

Summary of Fourth Preferred Embodiment

In the present fourth preferred embodiment, the reinforcing wire 5 is positioned on the opposite side of the semiconductor element 3 with respect to the main wiring wire 4 in a cross-sectional view. According to this configuration, since the connection region of the reinforcing wire 5 can be expanded, the number of reinforcing wires 5 connectable to the semiconductor element 3 can be increased. For example, when the reinforcing wire 5 having a length of 200 µm is connected to the semiconductor element 3 having a size of 5 mm×5 mm, the number of connectable reinforcing wires 5 is about 4 in the third preferred embodiment, but the number of connectable reinforcing wires 5 can be increased to about 8 in the present fourth preferred embodiment. As a result, since the anchor effect of the scaling resin 6 by the wire is improved, further improvement in the peeling suppression effect can be expected.

<Modification>

Figure 9:
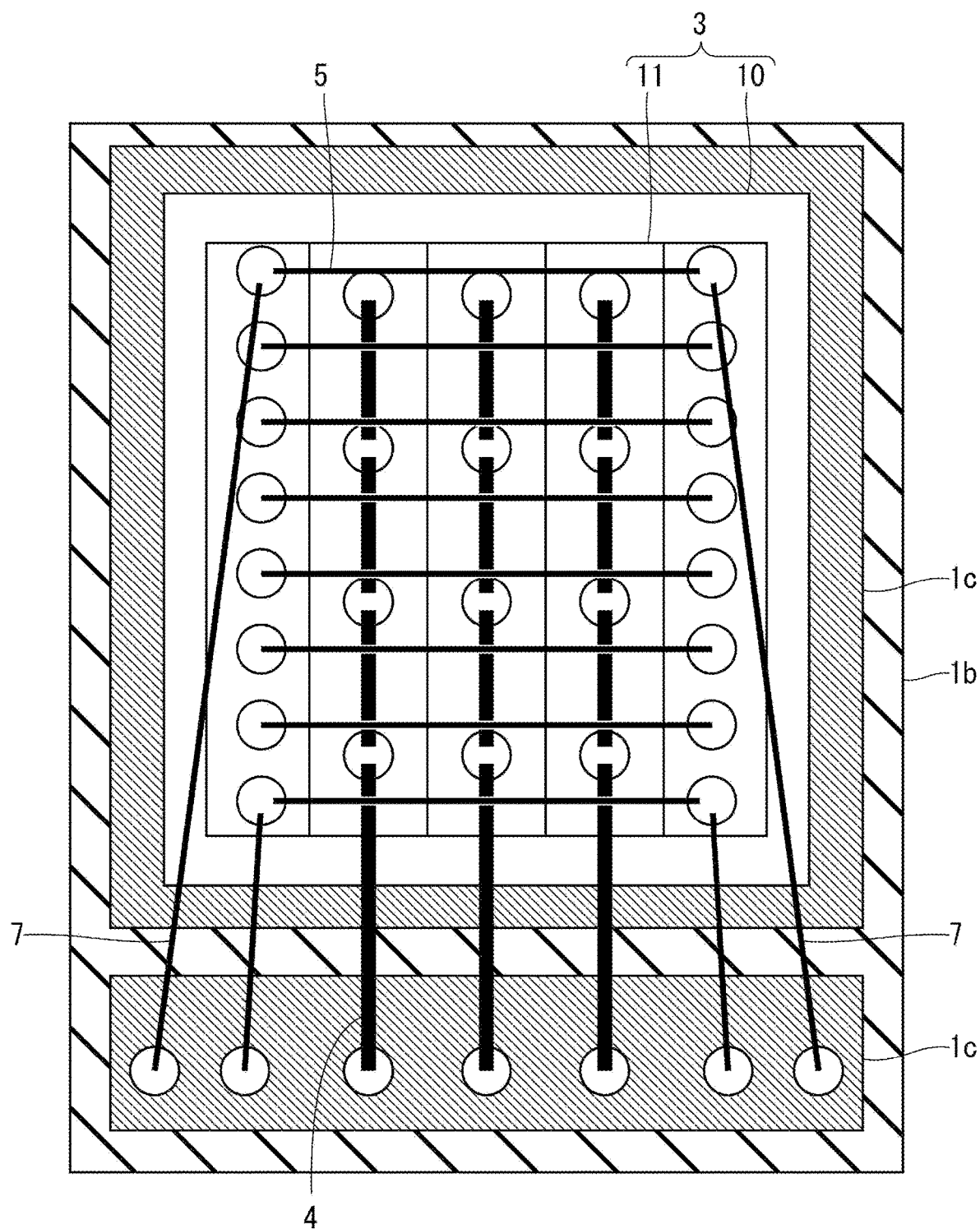
FIG. 9 is a plan view showing a configuration of a semiconductor device according to a modification of the fourth preferred embodiment.

FIG. 9 is a plan view showing a configuration of a semiconductor device according to the present modification of the fourth preferred embodiment. The semiconductor device according to the present modification further includes a connecting reinforcing wire 7 that electrically connects the reinforcing wire 5 and the metal circuit pattern 1*c*. According to this configuration, since the reinforcing wire 5 can play a role of transmitting and receiving an electric signal, it is possible to compensate for a current density insufficient when the number of the main wiring wires 4 is reduced.

Fifth Preferred Embodiment

Figure 11:
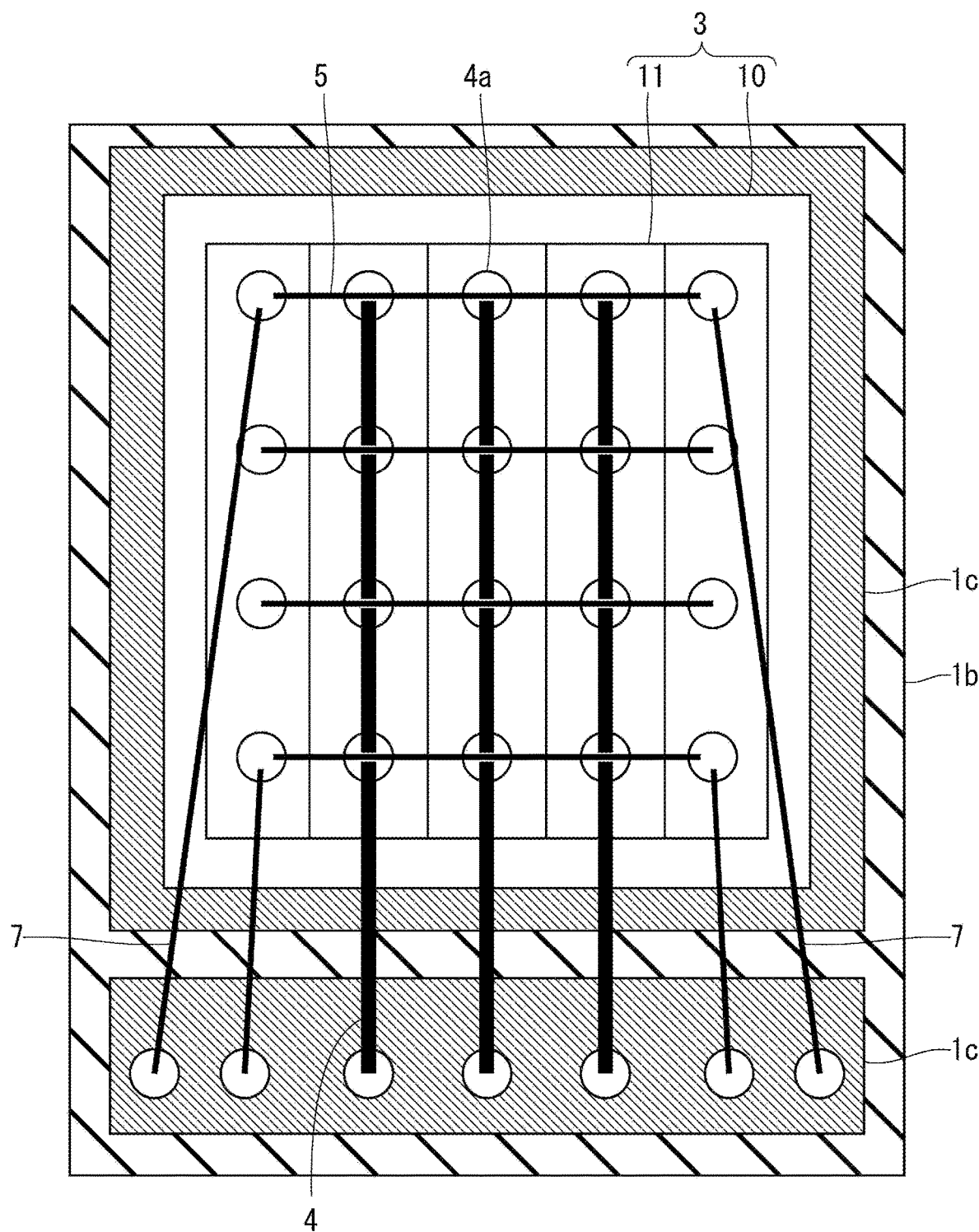
FIG. 11 is a plan view showing a configuration of the semiconductor device according to the fifth preferred embodiment.

FIG. 10 is a cross-sectional view showing a configuration of a semiconductor device according to the present fifth preferred embodiment, and FIG. 11 is a plan view showing the configuration. In the present fifth preferred embodiment, the reinforcing wire 5 is positioned on the opposite side of the semiconductor element 3 with respect to the connection portion 4a between the main wiring wire 4 and the semiconductor element 3 in a cross-sectional view. That is, the reinforcing wire 5 is positioned on the connection portion 4a of the main wiring wire 4.

Then, the height of the reinforcing wire 5 with respect to the semiconductor element 3 is lower than the height of the main wiring wire 4 with respect to the semiconductor element 3. In the example in FIG. 10, the height of the top portion of the loop of the reinforcing wire 5 is lower than the height of the top portion of the loop of the main wiring wire 4.

Summary of Fifth Preferred Embodiment

According to the configuration of the present fifth preferred embodiment, since the reinforcing wire 5 is close to the connection portion 4a of the main wiring wire 4, the anchor effect can be enhanced around the connection portion 4a of the main wiring wire 4, and peeling of the sealing resin 6 from the connection portion 4a can be intensively suppressed. In addition, as a result, since the number of reinforcing wires 5 can be reduced, the cycle time of the semiconductor device can be shortened, and the productivity can be enhanced.
<Modification>

Figure 12:
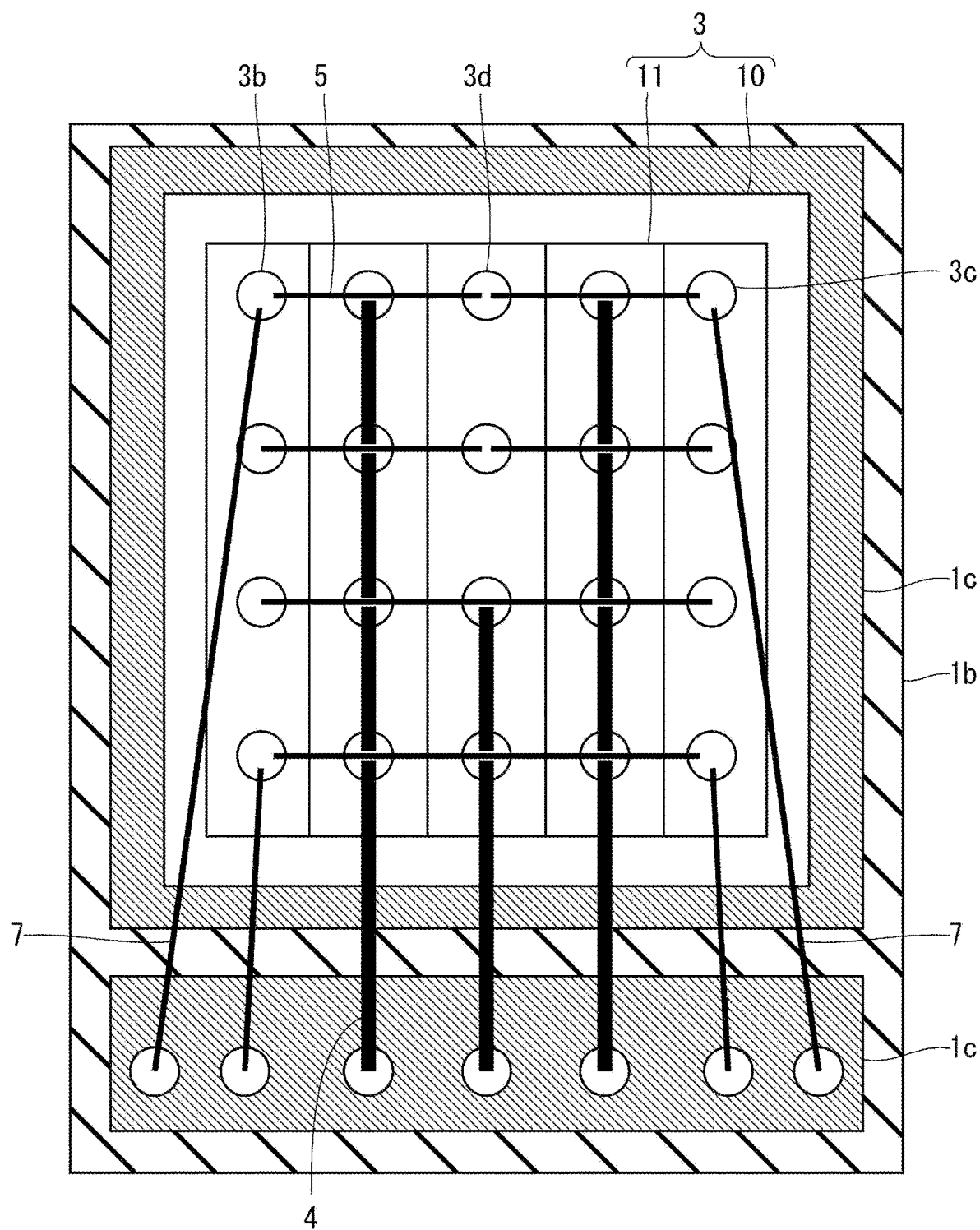
FIG. 12 is a plan view showing a configuration of a semiconductor device according to a modification of the fifth preferred embodiment.

FIG. 12 is a plan view showing a configuration of a semiconductor device according to the present modification of the fifth preferred embodiment. In the present modification, the reinforcing wire 5 is connected to a plurality of portions of the semiconductor element 3. The plurality of portions includes a first portion 3b, a second portion 3c, and a third portion 3d.

The first portion 3b is an end portion of the semiconductor element 3. The second portion 3c is an end portion opposite to the first portion 3b of the semiconductor element 3. It should be noted that the first portion 3b and the second portion 3c may be connected to the metal circuit pattern 1c by the connecting reinforcing wire 7. The third portion 3d is a portion between the first portion 3b and the second portion 3c.

According to this configuration, since the reinforcing wire 5 is connected not only to the first portion 3b and the second portion 3c being the end portions of the semiconductor element 3 but also to the third portion 3d being the central portion, the rigidity of the reinforcing wire 5 can be enhanced. Accordingly, since deformation of the reinforcing wire 5 due to repeated thermal stress can be suppressed, a stronger anchor effect can be obtained and the peeling suppression effect can be further enhanced.

It should be noted that in the fifth preferred embodiment and the modification thereof the reinforcing wire 5 is electrically connected to the semiconductor element 3, but does not need to be electrically connected.

Sixth Preferred Embodiment

Figure 14:
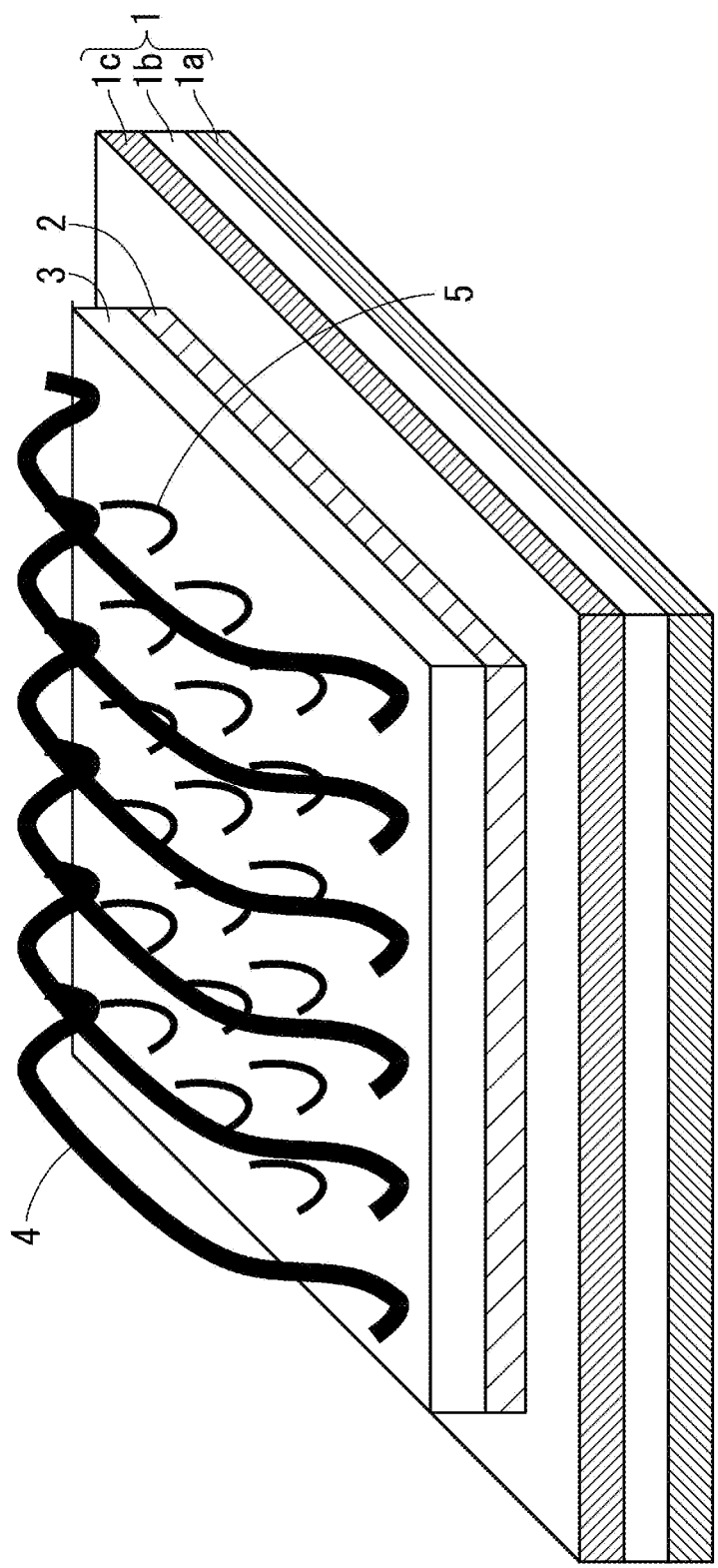
FIGS. 14 and 15 are three-dimensional views each showing a configuration of the semiconductor device according to the sixth preferred embodiment.

FIG. 13 is a cross-sectional view showing a configuration of a semiconductor device according to the present sixth preferred embodiment. FIG. 14 is a three-dimensional view showing a configuration of the semiconductor element 3 on the left side in FIG. 13, and FIG. 15 is a three-dimensional view showing a configuration of the semiconductor element 3 on the right side in FIG. 13.

As shown in FIG. 13, the reinforcing wire 5 is positioned below the loop of the main wiring wire 4, and both end portions of the reinforcing wire 5 are positioned inside the outline of the semiconductor element 3 in a plan view. Then, each reinforcing wire 5 is provided for each connection portion with the semiconductor element 3. That is, a material wire is cut off every time the material wire is connected to the semiconductor element 3, whereby a reinforcing wire 5 is formed. The reinforcing wire 5 has substantially the same function as a bump.

Figure 15:
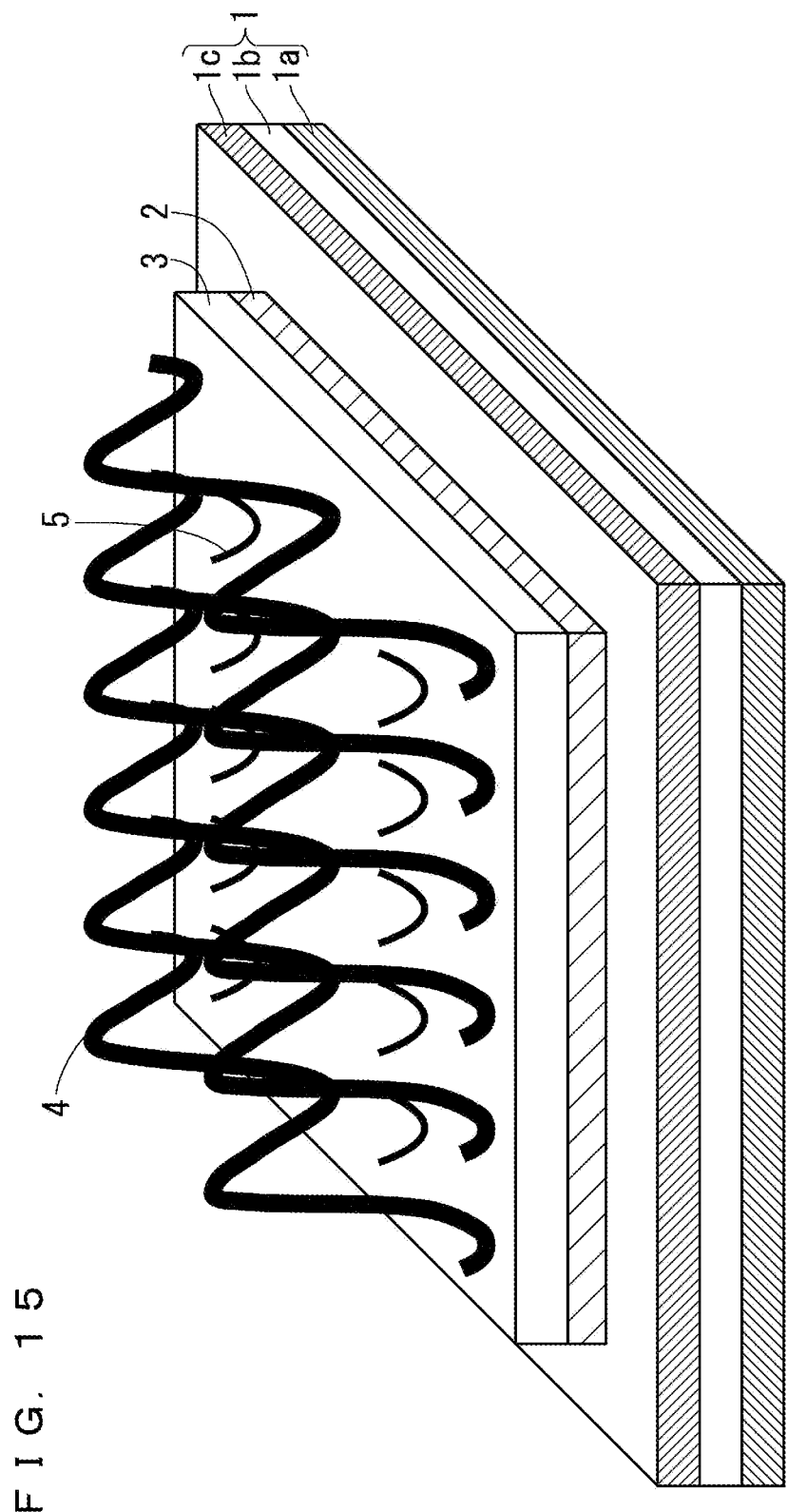

The angle formed by the main wiring wire 4 and the reinforcing wire 5 in a plan view is substantially 0 degrees in FIG. 14 and substantially 90 degrees in FIG. 15, but is not limited thereto. When a thin wire having a diameter of 50 μm or less is used for the reinforcing wire 5, the bump formed of the reinforcing wire 5 preferably has a ball bond shape.

Summary of Sixth Preferred Embodiment

In the present sixth preferred embodiment the reinforcing wire 5 forms a bump by being provided at each connection portion with the semiconductor element 3. According to this configuration, it is possible to increase the number of connection places of the reinforcing wire 5 connectable to the semiconductor element 3. For example, when the reinforcing wire 5 having a diameter of 200 μm is connected at a pitch of 3 mm without being separated, the number of connection places of the reinforcing wire 5 connectable to the semiconductor element 3 having a size of 10 mm×10 mm is four. On the other hand, in the present sixth preferred embodiment, since a bump made of the reinforcing wire 5 at a pitch of 2 mm or less can be connected to the semiconductor element 3 having the same size, the number of connection places of the connectable reinforcing wire 5 can be increased to five or more. As a result, since the anchor effect of the sealing resin 6 by the wire is improved, further improvement in the peeling suppression effect can be expected.

In addition, in general, the longer the loop of wire, the more the wire is affected by the expansion and contraction of the sealing resin 6 due to repeated thermal stress. However, in the present sixth preferred embodiment, the reinforcing wire 5 is a bump without a loop, and the influence can be reduced, so that the stress generated in the connection portion between the reinforcing wire 5 and the semiconductor element 3 can be alleviated. Therefore, improvement in the connection strength of the reinforcing wire 5 itself can also be expected. It should be noted that in the example in FIG. 13, the reinforcing wire 5 is positioned below the main wiring wire 4, but a part of the reinforcing wire 5 may be configured to be positioned above the main wiring wire 4.

Seventh Preferred Embodiment

FIG. 16 is a plan view showing a configuration of a semiconductor device according to the present seventh preferred embodiment. As shown in FIG. 16, in the present seventh preferred embodiment, the reinforcing wire 5 is not a linear wire but a plate-shaped ribbon wire. The reinforcing wire 5 being a ribbon wire is positioned below the loop of the main wiring wire 4. It should be noted that in FIG. 16, all of the plurality of reinforcing wires 5 are ribbon wires, but some of the reinforcing wires 5 may be linear wires and the remaining reinforcing wires 5 may be ribbon wires. In addition, in FIG. 16, the connection portion between the semiconductor element 3 and the reinforcing wire 5 is shown in a rectangular shape, and the shape of the connection portion is not limited to a rectangular shape. In addition, in FIG. 16, the reinforcing wire 5 is positioned below the loop of the main wiring wire 4, but may be positioned above the loop of the main wiring wire 4.

Summary of Seventh Preferred Embodiment

In the present seventh preferred embodiment, since the reinforcing wire 5 is a ribbon wire, the area covering the upper surface of the semiconductor element 3 can be increased as compared with that of the linear wire, and the gap between the reinforcing wires 5 can be narrowed. Therefore, a stronger anchor effect can be obtained, and not only the peeling suppression effect can be further enhanced, but also the temperature uniformity of the portion on the semiconductor element 3 can be enhanced.

<Modification>

Figure 17:
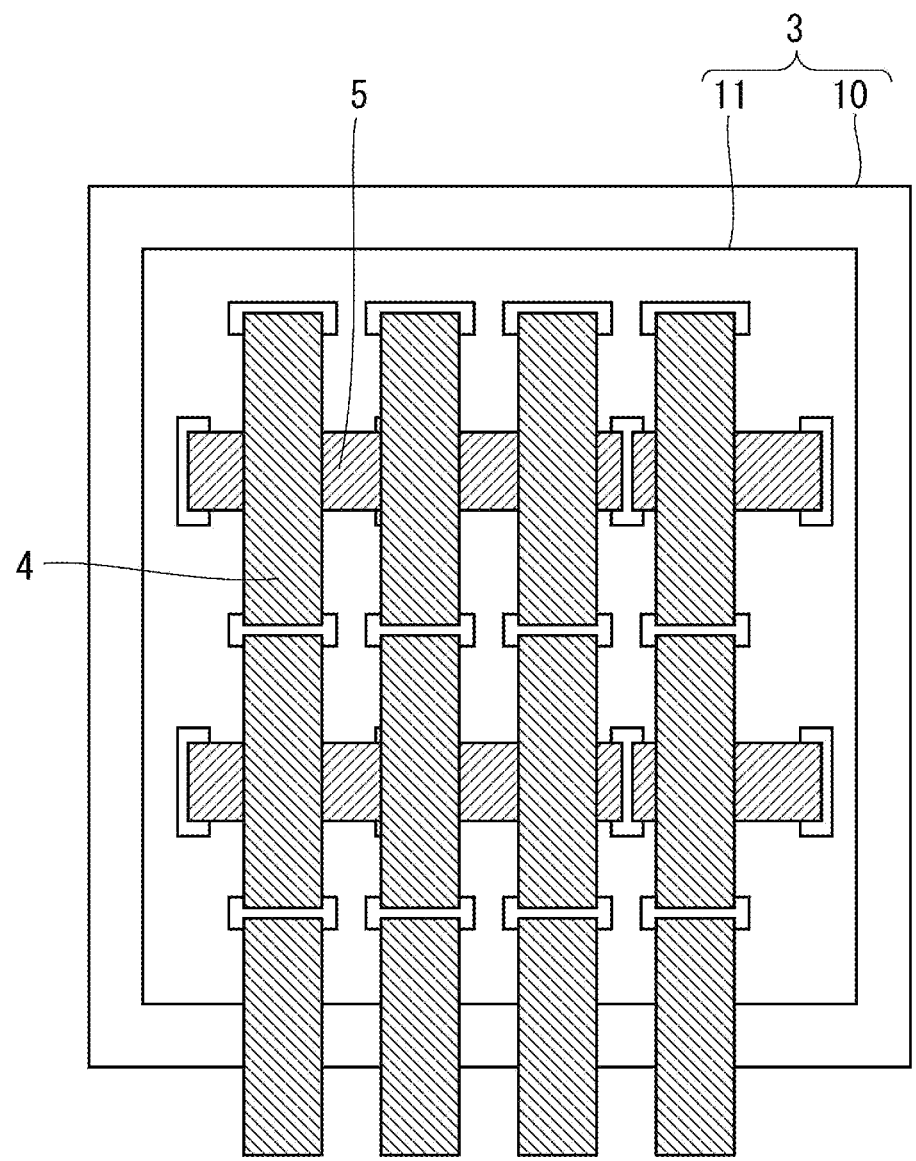
FIG. 17 is a plan view showing a configuration of a semiconductor device according to a modification of the seventh preferred embodiment.

FIG. 17 is a plan view showing a configuration of a semiconductor device according to the present modification of the seventh preferred embodiment. As shown in FIG. 17, not only the reinforcing wire 5 but also the main wiring wire 4 may be a ribbon wire. By using the ribbon wire for both the main wiring wire 4 and the reinforcing wire 5, the main wiring wire 4 and the reinforcing wire 5 can be formed with the same wire bonding apparatus, so that the introduction device cost can be suppressed or the productivity can be improved.

Eighth Preferred Embodiment

FIG. 18 is a plan view showing a configuration of a semiconductor device according to the present eighth preferred embodiment. The semiconductor device according to the present eighth preferred embodiment includes semiconductor elements 31 and 32 as a plurality of semiconductor elements 3 that perform the same switching operation. It should be noted that in FIG. 18, the number of the plurality of semiconductor elements performing the same switching operation is 2, but may be 3 or more. In FIG. 18, each of the semiconductor elements 31 and 32 includes five effective regions 11a to 11e being a plurality of pattern regions provided on the upper surface. It should be noted that the number of effective regions 11a to 11e has only to be plural and is not limited to five.

The connecting wire 5a being a part of the reinforcing wire 5 is connected between the semiconductor elements 31 and 32. The remainder of the reinforcing wire 5 is connected to a plurality of portions of one or more semiconductor elements 31 and 32 as in the first preferred embodiment and the like. In FIG. 18, the remainder of each reinforcing wire 5 is electrically connected to any one of the semiconductor elements 31 and 32, and is electrically connected to each of the five effective regions 11a to 11e.

Summary of Eighth Preferred Embodiment

In the conventional technique, since a part of the main wiring wire 4 is used for a connecting wire for connecting between the plurality of semiconductor elements, the degree of freedom in designing the main wiring wire 4 is low, and the number of connecting wires is about 1 to 2. However, in the eighth preferred embodiment, since a part of the reinforcing wire 5 is a connecting wire 5a, the number of connecting wires can be increased. Therefore, the electric signal delay between the semiconductor elements 31 and 32 can be improved, the potential distribution can be equalized, and the signal oscillation suppression effect can be enhanced.

In addition, in the first to seventh preferred embodiments, the anchor effect of the sealing resin 6 by the wire is obtained only on the semiconductor element 3, but in the present eighth preferred embodiment, since the anchor effect can be obtained between a plurality of semiconductor elements 3, the peeling suppression effect can be further enhanced.

In general, when the reinforcing wire 5 is provided on the metal circuit pattern 1c, an anchor effect can be obtained, but when the metal circuit pattern 1c is provided between the plurality of semiconductor elements 3, the distance between the plurality of semiconductor elements 3 becomes relatively large, and the size of the semiconductor device becomes large. On the other hand, in the present eighth preferred embodiment, the reinforcing wire 5 is provided between the plurality of semiconductor elements rather than being provided on the metal circuit pattern 1c, so that the distance between the plurality of semiconductor elements 3 can be shortened, and the size of the semiconductor device can be reduced.

In addition, in the present eighth preferred embodiment, a plurality of portions to which the reinforcing wires 5 are connected in the semiconductor element 3 are provided in each of the effective regions 11a to 11e. According to this configuration, the electric signal delay between the effective regions 11a to 11e can be improved, the potential distribution can be equalized, and the signal oscillation suppression effect can be enhanced.

<Modification>

FIG. 19 is a plan view showing a configuration of a semiconductor device according to the present modification of the eighth preferred embodiment. As shown in FIG. 19, a plurality of portions to which the reinforcing wires 5 are connected in the semiconductor element 3 are not provided in each of the effective regions 11a to 11e, but have only to be provided in two or more effective regions of the effective regions 11a to 11e. In FIG. 19, one reinforcing wire 5 is electrically connected to the effective regions 11a, 11c, and 11e, and another reinforcing wire 5 is electrically connected to the effective regions 11b and 11d. According to this configuration, since the pitch of the connection portion between the reinforcing wire 5 and the effective regions 11a to 11e can be increased, the connection between the reinforcing wire 5 and the effective regions 11a to 11e can be facilitated even when the size of the semiconductor element 3 is reduced.

It should be noted that each of the preferred embodiments and each of the modifications can be freely combined, and each of the preferred embodiments and each of the modifications can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor device comprising:
   at least one semiconductor element;
   a main wiring wire electrically connected to the at least one semiconductor element;
   a reinforcing wire connected to the at least one semiconductor element, the reinforcing wire being positioned on the same side as the at least one semiconductor element or on the opposite side of the at least one semiconductor element, with respect to the main wiring wire in a cross-sectional view; and a sealing resin configured to cover the at least one semiconductor element, the main wiring wire, and the reinforcing wire, wherein the reinforcing wire is connected to a plurality of portions of the at least one semiconductor element, or both end portions of the reinforcing wire are positioned inside an outline of the at least one semiconductor element in a plan view, and each of the reinforcing wire and the main wiring wire is individually connected to the at least one semiconductor element.

2. The semiconductor device according to claim 1, wherein the reinforcing wire is parallel to the main wiring wire in a plan view.

3. The semiconductor device according to claim 1, wherein the reinforcing wire intersects with the main wiring wire in a plan view.

4. The semiconductor device according to claim 1, wherein the reinforcing wire is positioned on the same side as the at least one semiconductor element with respect to the main wiring wire in a cross-sectional view.

5. The semiconductor device according to claim 1, wherein the reinforcing wire is positioned on the opposite side of the at least one semiconductor element with respect to the main wiring wire in a cross-sectional view.

6. The semiconductor device according to claim 5, wherein the reinforcing wire is positioned on the opposite side of the at least one semiconductor element with respect to a connection portion between the main wiring wire and the at least one semiconductor element in a cross-sectional view, and a height of the reinforcing wire with respect to the at least one semiconductor element is lower than a height of the main wiring wire with respect to the at least one semiconductor element.

7. The semiconductor device according to claim 1, wherein the reinforcing wire is connected to the plurality of portions of the at least one semiconductor element, and the plurality of portions include a first portion being an end portion of the at least one semiconductor element, a second portion being an end portion opposite to the first portion, and a third portion being a portion between the first portion and the second portion.

8. The semiconductor device according to claim 1, wherein both the end portions of the reinforcing wire are positioned inside the outline of the at least one semiconductor element in a plan view, and the reinforcing wire is provided for each connection portion with the at least one semiconductor element.

9. The semiconductor device according to claim 1, wherein the reinforcing wire includes a ribbon wire.

10. The semiconductor device according to claim 1, wherein the at least one semiconductor element comprises a plurality of semiconductor elements, and the reinforcing wire is connected to the plurality of portions of the at least one semiconductor element and is connected between the plurality of semiconductor elements.

11. The semiconductor device according to claim 1, wherein the reinforcing wire is connected to the plurality of portions of the at least one semiconductor element, the at least one semiconductor element includes a plurality of pattern regions, and the plurality of portions are provided in two or more pattern regions of the plurality of pattern regions.

12. The semiconductor device according to claim 1, wherein the reinforcing wire is connected to the plurality of portions of the at least one semiconductor element, and both end portions of the reinforcing wire are positioned inside the outline of the at least one semiconductor element in a plan view.

13. The semiconductor device according to claim 1, wherein the main wiring wire is directly mechanically connected to a surface of the at least one semiconductor element, and the reinforcing wire is directly mechanically connected to the surface of the at least one semiconductor element.

14. A semiconductor device comprising:

a plurality of semiconductor elements;

a main wiring wire electrically connected to at least one semiconductor element of the plurality of semiconductor elements;

a reinforcing wire connected to the at least one semiconductor element, the reinforcing wire being positioned on the same side as the at least one semiconductor element or on the opposite side of the at least one semiconductor element, with respect to the main wiring wire in a cross-sectional view; and a sealing resin configured to cover the at least one semiconductor element, the main wiring wire, and the reinforcing wire, wherein the reinforcing wire is connected to a plurality of portions of the at least one semiconductor element and is connected between the plurality of semiconductor elements.

15. A semiconductor device comprising:

at least one semiconductor element;

a main wiring wire electrically connected to the at least one semiconductor element;

a reinforcing wire connected to the at least one semiconductor element, the reinforcing wire being positioned on the same side as the at least one semiconductor element or on the opposite side of the at least one semiconductor element, with respect to the main wiring wire in a cross-sectional view; and a sealing resin configured to cover the at least one semiconductor element, the main wiring wire, and the reinforcing wire, wherein the reinforcing wire is connected to a plurality of portions of the at least one semiconductor element, the at least one semiconductor element includes a plurality of pattern regions, and the plurality of portions are provided in two or more pattern regions of the plurality of pattern regions.

* * * * *